United States Patent
Mok

(10) Patent No.: US 6,867,967 B2
(45) Date of Patent: Mar. 15, 2005

(54) METHOD OF CONSTRUCTING A MULTICOMPUTER SYSTEM

(75) Inventor: Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/320,181

(22) Filed: Dec. 16, 2002

(65) Prior Publication Data

US 2004/0114323 A1 Jun. 17, 2004

(51) Int. Cl.[7] ................................................. H05K 7/20
(52) U.S. Cl. ....................... 361/687; 361/695; 361/701; 454/184; 236/49.3
(58) Field of Search ................................. 361/678, 687, 361/699, 696, 698, 701, 691–695, 727; 176/15.1, 16.1; 145/184; 165/80.31, 80.4, 80.5, 903, 104.19, 104.33, 104.34; 62/414, 418, 419, 259.2, 263, 426

(56) References Cited

U.S. PATENT DOCUMENTS

| | | | | |
|---|---|---|---|---|
| 4,158,875 A | * | 6/1979 | Tajima et al. ................ | 361/695 |
| 5,460,441 A | * | 10/1995 | Hastings et al. ............. | 312/298 |
| 6,034,873 A | * | 3/2000 | St.ang.hl et al. ............. | 361/701 |
| 6,186,890 B1 | * | 2/2001 | French et al. ................ | 454/184 |
| 6,374,627 B1 | * | 4/2002 | Schumacher et al. ....... | 62/259.2 |
| 6,494,050 B2 | * | 12/2002 | Spinazzola et al. .......... | 62/89 |
| 6,496,366 B1 | * | 12/2002 | Coglitore et al. ............ | 361/687 |
| 6,516,954 B2 | * | 2/2003 | Broome ........................ | 211/26 |
| 6,525,935 B2 | * | 2/2003 | Casebolt ...................... | 361/687 |
| 6,574,104 B2 | * | 6/2003 | Patel et al. .................. | 361/695 |
| 6,615,524 B2 | * | 9/2003 | Valiulis ........................ | 40/638 |
| 6,672,955 B2 | * | 1/2004 | Charron ....................... | 454/184 |
| 2004/0017654 A1 | * | 1/2004 | Modica ........................ | 361/687 |
| 2004/0099747 A1 | * | 5/2004 | Johnson et al. ............. | 236/49.3 |

FOREIGN PATENT DOCUMENTS

DE      2537295 A   *   4/1976            H05K/6/76

OTHER PUBLICATIONS

"Celluar Processing Tools for High–Performance Simulation", D. Talia, Sep. 2000, pp. 44 through 52.

"Method of Packaging Discrete Electronics Entities", IBM Technical Disclosure Bulletin, vol. 36. No 09A, Sep. 1993.

* cited by examiner

Primary Examiner—Michael Datskovsky
(74) Attorney, Agent, or Firm—Scully, Scott, Murphy & Presser; Daniel P. Morris

(57) ABSTRACT

A method of constructing a multicomputer system consisting of a multiplicity of multiple computing units connected together in multiple dimensions. Furthermore, also disclosed is a novel method and arrangement for constructing a computer system constituted of multiple computing units, and wherein air ducting and plenum arrangement direct cooling air flows through the computer system so as to dissipate heat generated by the multiplicity of electronic components of the computer system.

24 Claims, 3 Drawing Sheets

METHOD OF CONSTRUCTING A MULTICOMPUTER SYSTEM

BACKGROUND OF THE INVENTION

1. Field of the Invention

The present invention relates to a method of constructing a multicomputer system consisting of a multiplicity of multiple computing units connected together in multiple dimensions. Furthermore, the invention also pertains to a novel method and arrangement for constructing a computer system constituted of multiple computing units, and wherein air ducting and plenum arrangement direct cooling air flows through the computer system so as to dissipate heat generated by the multiplicity of electronic components of the computer system.

The concept of combining multiple electronic entities, such as computing units in various dimensions, so as to derive a unitary three dimensionally arranged construction is basically known in the technology. In this connection, it has been a constant quest in the technology to derive ever faster operating computer systems. Basically, in order to gain computational speed in a computer system, two approaches have been employed in the technology, and in which a difficulty has been encountered in that the large number of operable computing units which are connected together may be in the order of thousands of units in order to form a super computer class system, wherein it is a further challenge to construct system hardware which occupies a smaller amount of space and utilizes the shortest connection cables while concurrently providing an efficient cooling method for the entire computer system.

In essence, a first one of the major approaches employed resides in increasing the processing speed of the central processing unit (CPU) of a computer, and the other approach would be to employ multiple CPUs which are connected together so as to form an array of processors which implement the computational tasks in a parallel operative relationship. In second or latter approach, multiple ways are available in order to connect the numerous CPUs together to form a single computer system. Thus, it is possible to bundle a small set of CPUs as a single cell, and thereafter a set of these computing cells are then connected into a multidimensional lattice type of network. Thus, for instance in a 3-dimensional lattice-type of network, each computing cell can be considered conceptually as a six-sided cube and accordingly, provided with a communication connection to adjacent cells from each of the six surfaces of the conceptual cube. Furthermore, each cell can then communicate to all of its six neighboring cells through this type of communication connection.

Furthermore, in a computer system employing this type of cell structural or architectural concept, the complexity of constructing the communication connections among the large number of computing cells dramatically increases as the number of cells are increased, whereby conventional methods of packaging computing hardware together maybe inadequate to provide the desired computer system.

Moreover, it is also important to be able to adequately and in a ready manner cool the extensive numbers of computing unit constituting the entire computer system so as to impart a sufficient degree of cooling to each of the individual computing cells or units.

2. Discussion of the Prior Art

D. Talia "Cellular Processing tools for High-Performance Simulation", Computer, September 2000, page 44, describes cellular processing tools wherein considerable numbers of individual cellular tools are combined into a large lattice type network arrangement forming a computer system. However, this publication does not describe the particular construction employing the presently derived concepts of adequately cooling each of the computing cells or pressing units.

Furthermore, L. Mok in an article entitled "Method of Packaging Discrete Electronic Entities", IBM TDB, Volume 36, No. 09A, September 1993, discloses a method of packaging discrete electronic entities so as to form a large computer system which is interconnected through cables within a common housing. The limited space which accommodates the number of cables among the computing cells in the computer system is adapted to provide adequate cooling the computing hardware. However, the publication does not provide any particular detail as to a unitary cooling system for effectuating the desired cooling in a simple and efficient manner as contemplated by the present invention.

SUMMARY OF THE INVENTION

Accordingly, the present invention provides for the construction of a multi computer system wherein within the confines of a semi-open computer frame having multiple sliding drawer-like boxes there are supported computing units which are adapted to be interconnected in a three-dimensional arrangement. The method and arrangement provides for cables connecting the multiplicity of computing units, whereby multiple wiring boards are plugged into a back plane vertically or at an angle, and these backplanes which are refereed to as computing boards have various computing units wired together.

Each of the drawer-like boxes is provided with its own cooling fans and/or a plenum which either draws or blows cooling air past the computing boards, and which in a novel manner affords adequate cooling air to be circulated through the spaces defined by the multiple printed-wiring boards and back planes so as to cause warm air emitted from the electronics in computer frames to be circulated outwardly of the computer system.

Accordingly, it is a basic object of the present invention to provide a novel method of forming a multi computer system which enables the efficient interconnection of a multiplicity of computing units and the efficient cooling thereof in a simple manner.

Another object of the invention resides in the provision of an arrangement for the design of a novel computer system constituted of a multiplicity of computing units interconnected in a multidimensional relationship in a computer box with a semi-open framework, and which includes novel cooling installations for readily and efficiently cooling each of the computing units.

BRIEF DESCRIPTION OF THE ACCOMPANYING DRAWINGS

Reference may now be made to the following detailed description of preferred embodiments of the invention, taken in conjunction with the accompanying drawings; in which.

DETAILED DESCRIPTION OF PREFERRED EMBODIMENTS

Figure 1:
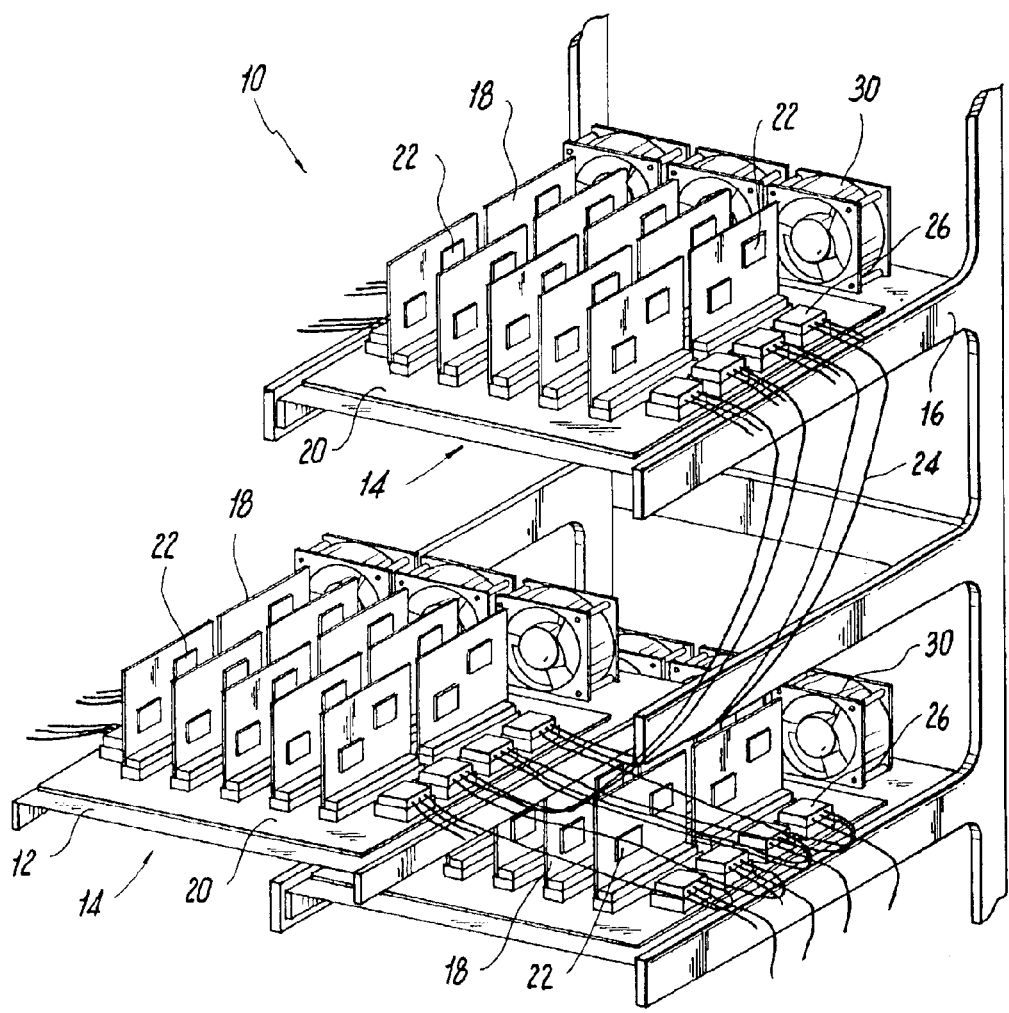
FIG. 1 illustrates a perspective view of a computer box with a slideable frame structure in a semi-open condition for holding a multi-computer system.
Figure 2:
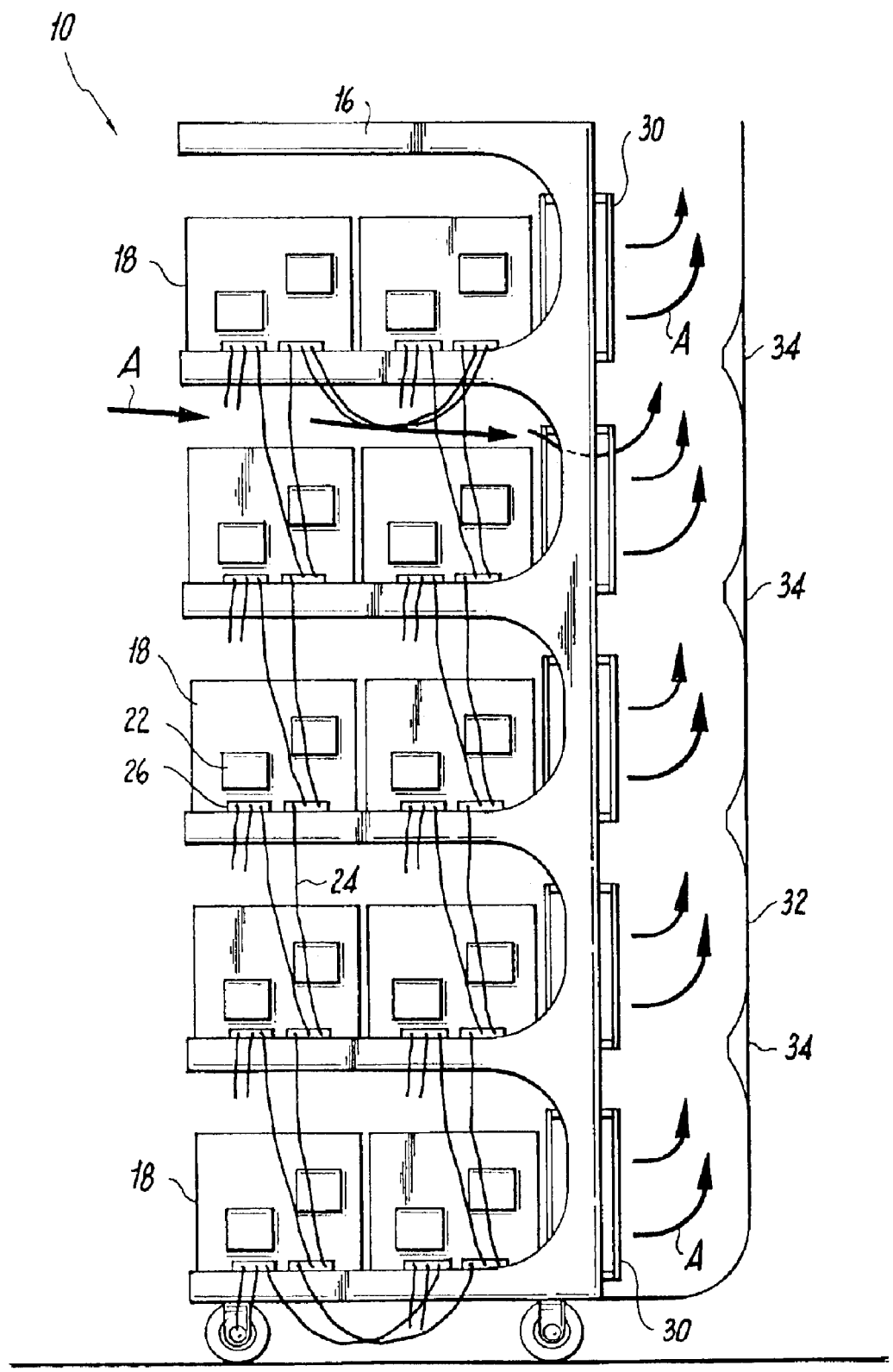
FIG. 2 illustrates a side view of the computer box arrangement of FIG. 1.

Referring in particular to FIGS. 1 and 2 of the drawings, there is illustrated a semi-open computer box 10 having multiple sliding drawer structure 12 which comprises different units 14 each adapted to hold computing hardware. For purposes of clarity, only the major components of the computer system are illustrated in the drawing figures, and the power supply, the necessary box covers and EMI shields are not illustrated herein.

The computer box 10 includes a plurality of the drawer-like units 14 in an essentially vertically stacked arrangement, which units may be adapted to be slid in and out from the box frame 16. A section of printed wiring board 20 which is commonly referred to as a back plane, is placed on an inner surface of each drawer-like unit 14, and with a plurality or multiple of the printed wiring boards 18 being plugged into the back plane 20 vertically or at an angle. These small printed wiring boards 18 are commonly referred to as computing boards and possess a plurality of computing cells 22 which are wired together. The computing boards 18 can be designed so as to be hot swappable as is known in the technology. In the embodiment as herein illustrated, each computing board 18 consists of two of the computing cells 22 which may be wired as 2×1 array, whereas one back plane has ten computing boards which are wired as 2×10 arrays. The cables 24 and their connectors 26, as illustrated in the drawings, are examples only and do not represent the actual number of cables in the system.

Thus, by way of example the total number of cables in a system with (i×j×k) numbers of computing cells 22 connected in a three-dimensional lattice array is defined by the equation $C=6ijk-2\{[(i-1)j+(j-1)i]k+(k-1)ij\}$, where i, j, k represent the number of cells in each of the various dimensions of the three dimensional lattice. Thus, for instance, for a lattice of 10×10×10 cells, the total number of cables which connect all of the cells is 600, this being the number of cables from the logical sense. However, the actual physical number of cables may vary, thus when it is required to provide two physical cables in order to handle the signals going in and out of one surface of a computing cell 22, the number of actual cables 24 in a system will be doubled. Furthermore, some of the cables can be readily replaced by means of printed wires on the printed-wiring boards 20 where the computing hardware is located.

Each drawer-like unit in this embodiment, is equipped with its own cooling fans 30, which either draw in or blow air to the computing boards 18. A plenum 32 is provided adjacent to the fans 30 so as to guide the airflow as illustrated in FIG. 2 through the various arrows A. The plenum 32 is removable and the direction of airflow can be readily changed so as to adapt to the cooling air arrangement or location at which the computer box 10 is installed. Thus, although it is shown in this instance that the air travels upwardly within the plenum 32, it is also possible that the air diverters 34 in the interior of the plenum 32 can be inverted to cause the air to discharge downwardly or towards each of the sides (i.e. either into or not from the plane of the drawing) at the locations proximate the cooling fans 30. Then fans 30 can be mounted either perpendicularly or at an angle relative to the back planes 20.

The cooling air arrangement as illustrated in FIG. 2 may, alternatively have the diverters 34 placed so as to be directed towards the side in order to blow air sideways in opposite directions rather than downwardly or upwardly, contrary to FIG. 2 of the drawings.

Figure 3:
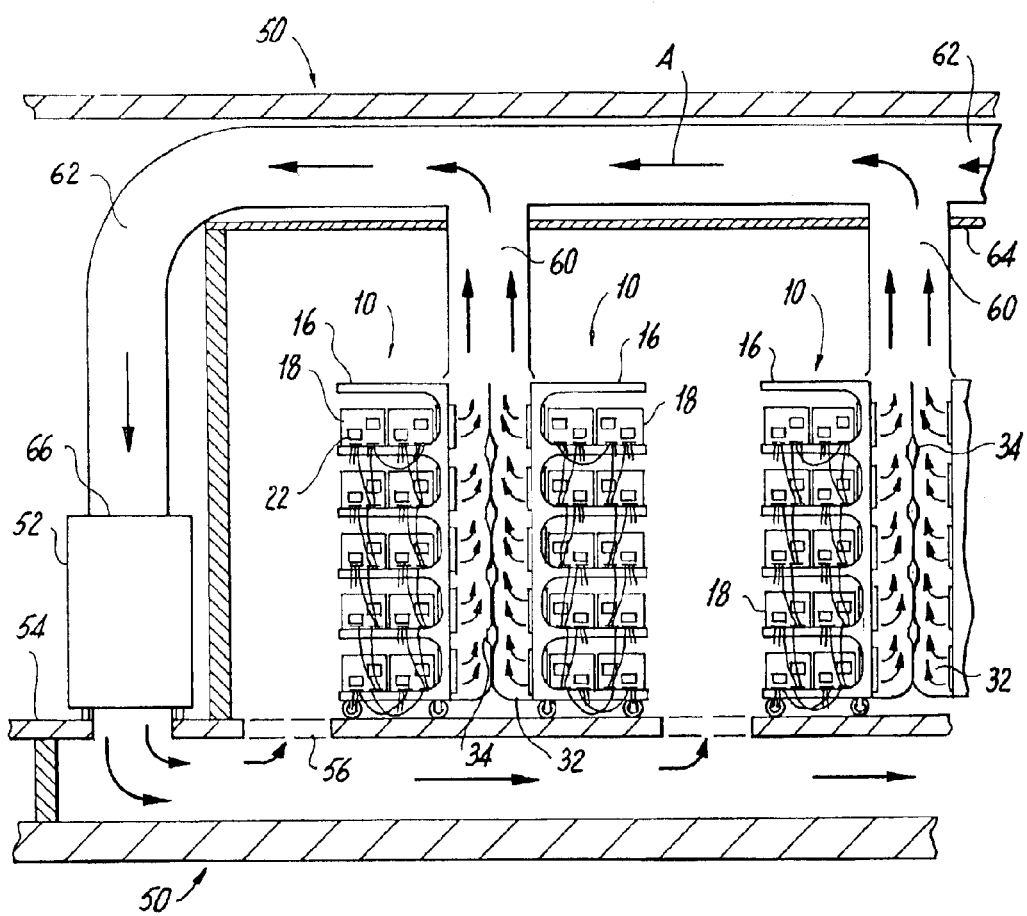
FIG. 3 illustrates a side view of a cooling arrangement for multiple computer boxes located in a computer room installation.

Reverting to the embodiment of FIG. 3 of the drawings, in this instance, a plurality or array of computer boxes are positioned on a raised floor of a room or the like in a spaced relationship relative to each other.

Thus, reverting in detail to drawing FIG. 3, in which similar or identical components as before are designated by the same reference numerals, the space for containing the multi-computer system may be a computer room 50, a plurality of conventional air conditioners 52 maybe employed to cool the arrays of computer boxes 10. In that particular instance, cool air emanating from the air conditioner or conditioners 52 streams through the zones between the computer boxes by circulating through a raised floor 54 having perforated tiles 56, whereby warm air emanating from the computer boxes 10 then collected in plenums 32 as illustrated, and conducted into the connecting ducts 60 positioned above the plenums. The warm air streams back into the air conditioners 52 through ducts 62, as illustrated by the arrows above the ceiling 64 of the computer room 50, and ducts 66 leading into the air conditioner. Then air is cooled in the air conditioner or conditioners 52 so that cool air exiting through the bottom of the air conditioners is then again circulated through the holes in the tiles 56 of the floor 54 and upwardly through the computer boxes and up through the plenums 32 to the ducts above the computer room ceiling so as to be continually recirculated to the air conditioner 52. Alternatively, it is possible to reverse the air flow, and also both cool and warm air circulating ducts can be positioned above the ceiling in the event that a raised floor is not available. In that case, the cool air can be received separately from the cool air ducts above the ceiling and channeled down to the inlet side of the computer boxes 10 by another arrangement of ducts, not illustrated in the drawings.

As previously described, in each of the figures, each back plane in the drawed-like units consists of computing cells wired as 2×10 arrays and all the backplanes are connected by cable, whereby each unit will form a 3-dimensional cellular automation system with 2×10×10 lattice and five boxes and then be connected as a 10×10×10 lattice. The computer boxes may be positioned in this circle or a circle-like grouping so that the first and last boxes are next to each other, whereas the dimensions of the lattice as formed are not drawn to scale and not limited to what is illustrated. Furthermore, the cable lengths are minimized since each cable is connected to adjacent backplanes and boxes only, and furthermore the first and last computing cells 22 in anyone of the dimensions in the lattice network can be connected together to form a toroidal network without extra long cables. The length of each cable is typically about 1–2 meters. The connection in a first one connection is through the printed wires on the back planes; the connection in the second dimension is through the cables within the computer boxes; and in the third dimension is connected through cables across multiple computer boxes. The size of the arrays which are described herein is exemplary only, and can be expanded to any number.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A multicomputer system including a multiplicity of multiple computing units operatively interconnected in multiple dimensional configurations; said system comprising:

a multicomputer box comprising a computer frame of a generally semi-open structure;

a plurality of slidable drawer components arranged in spaced relationships in said computer frame, said computing units being supported on said slidable drawer components; and a plurality of air circulating means for directing flows of cooling air past said computing units into at least one plenum located proximate said multicomputer box so as to dissipate heat generated by said computing units, said plurality of air flow generating devices being mounted on each respective one of said slidable drawer components for conveying airflows towards said plenums and being movable in conjunction with said slidable drawer components, each said slidable drawer component comprising a plate member having a generally horizontal support surface; and a plurality of common printed wiring backplanes being mounted in spaced relationships on respectively each of said horizontal support surfaces, said airflow generating devices being positioned on said backplanes.

2. A multicomputer system as claimed in claim 1, wherein multiple computing units are plugged vertically or at an angle relative to each said backplane; and multiple connectors and cables access on both sides of said backplane with said computing units.

3. A multicomputer system as claimed in claim 1, wherein said at least one plenum is detachable from said multicomputer box and is adjustable so as to selectively direct flows of cooling air from the bottom upwardly, from the top downwardly or towards the sides relative to the frame structure of said multicomputer box.

4. A multicomputer system as claimed in claim 3, wherein said at least one plenum is selectively positionable at an inlet, outlet or at opposite sides of said multicornputer box.

5. A multicomputer system as claimed in claim 3, wherein said at least one plenum has internal air diverters for orienting flows of air through said at least one plenum in predetermined directions.

6. A multicomputer system as claimed in claim 1, wherein said computing units comprise multiple printed wiring boards with sets of computing hardware forming independent computing cells, said printed wiring boards being plugged vertically or at angles relative to another printed wiring board, said computing cells being wired by printed wires to form one or multiple dimensioned arrays.

7. A multicomputer system as claimed in claim 6, wherein said connections form a multidimensional lattice through connection cables extending between computing units and computer boxes.

8. A multicomputer system as claimed in claim 1, wherein a plurality of said multicomputer boxes are arranged in a computer room with outlets of a plurality of said plenum being connected to ducting leading to air conditioning means for conveying cooling air to said boxes.

9. A multicomputer system as claimed in claim 8, wherein the ducting extends above the ceiling of said computer room connecting the plenum outlets conveying air heated by the computing units to the inlet of said air conditioning means.

10. A multicomputer system as claimed in claim 9, wherein said cooling air from said air conditioning means is conveyed to the interiors of said multicomputer boxes through a perforated raised floor arrangement supporting said boxes.

11. A multicomputer system as claimed in claim 9, wherein cooling air from said air conditioning means is conveyed to the interiors of said multicomputer boxes through ducting extending above the ceiling of the computer room.

12. A method of constructing a multicomputer system including a multiplicity of multiple computing units operatively interconnected in multiple dimensional configurations; said method comprising:

providing a multicomputer box comprising a computer frame of a generally semi-open structure;

arranging a plurality of slidable drawer components in spaced relationships in said computer frame, said computing units being supported on said slidable drawer components, each said slidable drawer component comprising a plate member having a generally horizontal support surface; and a plurality of common printed wiring backplanes being mounted in spaced relationships on respectively each of said horizontal support surfaces;

providing a multiple cell component structure for all cells to be connected to a neighboring cell of each cell directly so as to form a closed loop connection in a three-dimensional lattice form; and providing a plurality of air circulating means for directing flows of cooling air past said computing units into at least one plenum so as to dissipate heat generated by said computing units and locating said plurality of airflow generating devices on each of said slidable drawer components for conveying airflows towards said at least one plenum, said airflow generating devices being slidable in conjunction with said slidable drawer components.

13. A method of constructing a multicomputer system as claimed in claim 12, wherein multiple computing units are plugged vertically or at an angle relative to each said backplane; and multiple connectors and cables access on both sides of said backplane with said computing units.

14. A method of constructing a multicomputer system as claimed in claim 12, wherein said at least one plenum is detachable from said multicomputer box and is adjustable so as to selectively direct flows of cooling air from the bottom upwardly, from the top downwardly or towards the sides relative to the frame structure of said multicomputer box.

15. A method of constructing a multicomputer system as claimed in claim 14, wherein said at least one plenum is selectively positionable at an inlet, outlet or at opposite sides of said multicomputer box.

16. A method of constructing a multicomputer system as claimed in claim 14, wherein said at least one plenum has internal air diverters for orienting flows of air through said at least one plenum in predetermined directions.

17. A method of constructing a multicomputer system as claimed in claim 12, wherein said computing units comprise multiple printed wiring boards with sets of computing hardware forming independent computing cells, said printed wiring boards being plugged vertically or at angles relative to another printed wiring board, said computing cells being wired by printed wires to form one or multiple dimensioned arrays.

18. A method of constructing a multicomputer system as claimed in claim 12, wherein said connections form a multidimensional lattice through connection cables extending between computing units and computer boxes.

19. A method of constructing a multicomputer system as claimed in claim 12, plurality of said multicomputer boxes are arranged in a computer room with outlets of a plurality of said plenums being connected to ducting leading to air conditioning means for conveying cooling air to said boxes.

20. A method of constructing a multicomputer system as claimed in claim 19, wherein the ducting extends above the ceiling of said computer room connecting the plenum outlets conveying air heated by the computing units to the inlet of said air conditioning means.

21. A method of constructing a multicomputer system as claimed in claim 20, wherein said cooling air from said air conditioning means is conveyed to the interiors of said multicomputer boxes through a perforated raised floor arrangement supporting said boxes.

22. A method of constructing a multicomputer system as claimed in claim 20, wherein cooling air from said air conditioning means is conveyed to the interiors of said multicomputer boxes through ducting extending above the ceiling of the computer room.

23. A method of constructing a multicomputer system as claimed in claim 18, wherein said cables have lengths of typically between about 1–2 meters.

24. A method of constructing a multicomputer system as claimed in claim 12, wherein said multicomputer cells are connected through wires on the pack planes; said second dimensional connection is through cables within each computer box; and said third dimensional connection is through cables across multiple computer boxes.

* * * * *

UNITED STATES PATENT AND TRADEMARK OFFICE
CERTIFICATE OF CORRECTION

PATENT NO. : 6,867,967 B2  
DATED : March 15, 2005  
INVENTOR(S) : Lawrence S. Mok It is certified that error appears in the above-identified patent and that said Letters Patent is hereby corrected as shown below:

Column 6,
Line 35, "as claimed in 12" should read -- as claimed in claim 12 --

Signed and Sealed this

Twelfth Day of July, 2005

JON W. DUDAS
*Director of the United States Patent and Trademark Office*